(12) United States Patent
Okuno

(10) Patent No.: US 8,465,997 B2
(45) Date of Patent: Jun. 18, 2013

(54) MANUFACTURING METHOD OF GROUP III NITRIDE SEMICONDUCTOR

(75) Inventor: Koji Okuno, Aichi-ken (JP)

(73) Assignee: Toyoda Gosei Co., Ltd., Aichin-Ken (JP)

( * ) Notice: Subject to any disclaimer, the term of this patent is extended or adjusted under 35 U.S.C. 154(b) by 241 days.

(21) Appl. No.: 12/659,173

(22) Filed: Feb. 26, 2010

(65) Prior Publication Data

US 2010/0248455 A1    Sep. 30, 2010

(30) Foreign Application Priority Data

Mar. 24, 2009  (JP) ................. P2009-071868

(51) Int. Cl.
*H01L 33/00* (2010.01)

(52) U.S. Cl.
USPC ....... 438/46; 257/103; 257/615; 257/E21.125

(58) Field of Classification Search
USPC ............. 438/46; 257/103, 615, E21.125
See application file for complete search history.

(56) References Cited

U.S. PATENT DOCUMENTS

| | | | | |
|---|---|---|---|---|
| 5,389,571 A * | 2/1995 | Takeuchi et al. | ............. | 117/89 |
| 5,780,873 A * | 7/1998 | Itaya et al. | ............. | 257/95 |
| 6,091,083 A * | 7/2000 | Hata et al. | ............. | 257/79 |
| 6,207,469 B1 | 3/2001 | Ota et al. | | |
| 7,974,322 B2 * | 7/2011 | Ueda et al. | ............. | 372/44.011 |
| 2001/0015437 A1 * | 8/2001 | Ishii et al. | ............. | 257/12 |
| 2006/0157717 A1 * | 7/2006 | Nagai et al. | ............. | 257/81 |
| 2008/0248639 A1 | 10/2008 | Moriyama | | |
| 2008/0311695 A1 * | 12/2008 | Ogawa et al. | ............. | 438/46 |
| 2009/0001409 A1 * | 1/2009 | Takano et al. | ............. | 257/103 |
| 2010/0320443 A1 * | 12/2010 | Jiang et al. | ............. | 257/14 |

FOREIGN PATENT DOCUMENTS

| JP | 11-126758 | 5/1999 |
|---|---|---|
| JP | 11-126758(A) | 5/1999 |
| JP | 2003-17420 | 1/2003 |

OTHER PUBLICATIONS

Japanese Notification of Reasons for Refusal dated Feb. 6, 2013 with English translation thereof.

* cited by examiner

*Primary Examiner* — John C Ingham
(74) *Attorney, Agent, or Firm* — McGinn IP Law Group, PLLC

(57) ABSTRACT

A manufacturing method of a group III nitride semiconductor comprising: preparing a substrate including a buffer layer; forming a first layer on the buffer layer from a group III nitride semiconductor by MOCVD while doping an anti-surfactant, wherein a thickness of the first layer is equal to or thinner than 2 μm; forming a second layer on the first layer from a group III nitride semiconductor by MOCVD while doping at least one of surfactant and an anti-surfactant; and controlling a crystalline quality and a surface flatness of the second layer by adjusting an amount of the anti-surfactant and the surfactant doped during the formation of the second layer.

17 Claims, 4 Drawing Sheets

MANUFACTURING METHOD OF GROUP III NITRIDE SEMICONDUCTOR

CROSS REFERENCE TO RELATED APPLICATIONS

This application claims priority from Japanese Patent Application No. 2009-071868 filed on Mar. 24, 2009, and the subject matter of which is incorporated herein by reference.

TECHNICAL FIELD

The present invention relates to a manufacturing method of high quality group III nitride semiconductors with few threading dislocations.

BRIEF DESCRIPTION OF RELATED ART

Group III nitride semiconductors such as gallium nitride (GaN) are used as a material for a light emitting diode (LED) and a semiconductor laser element. Recently, the group III nitride semiconductors draw attention as a material for high frequency devices and power devices.

For the purpose of a crystal growth of the group III nitride semiconductors, hetero-type substrates such as a sapphire substrate are used. Such hetero-type substrates have a lattice constant different from that of the group III nitride semiconductors. This lattice constant mismatch causes large number of threading dislocations in the group III nitride semiconductors. The threading dislocations enhance the current leak and deteriorate the luminescent efficiency of light emitting devices based on the group III nitride semiconductors.

In such recent situations, technologies to reduce the number of the threading dislocations and obtain high quality group III nitride semiconductors have been developed. An example of such related arts is JP-A-2003-17420. JP-A-2003-17420 discloses a crystal growth method where after an island growth (three dimensional growth) of the group III nitride semiconductors, which is induced by doping anti-surfactant silicon (Si), the fusion of the islands of the group III nitride semiconductors are promoted by reducing the amount of doping Si or stopping the Si doping so as to induce the two dimensional growth.

In the case where the group III nitride semiconductor is grown in the three dimensional growth by Si doping, the larger the amount of the Si doping is, the more the crystal quality is improved. Thus grown group III nitride semiconductor, however, has deteriorated flatness of the surface because of pits formed thereon and is not suitable for device purposes. Therefore, it is necessary to thickly grow the non-doped group III nitride semiconductor layer more than 5 μm in order to achieve enough surface flatness.

SUMMARY

Exemplary embodiments of the present invention address the above mentioned problems and may address the problems not mentioned above. The exemplary embodiments of the present invention provide the high quality group III nitride semiconductors with high surface flatness without increasing its thickness.

The first aspect of the exemplary embodiments of the present invention is a manufacturing method of a group III nitride semiconductor comprising: preparing a substrate including a buffer layer; forming a first layer on the buffer layer from a group III nitride semiconductor doped with an anti-surfactant by MOCVD, wherein a thickness of the first layer is equal to or thinner than 2 μm; forming a second layer on the first layer from a group III nitride semiconductor doped with at least one of surfactant and an anti-surfactant by MOCVD; and controlling a crystalline quality and a surface flatness of the second layer by adjusting an amount of the anti-surfactant and the surfactant doped during the formation of the second layer.

The second aspect of the exemplary embodiments of the present invention is the manufacturing method of the first aspect, wherein an anti-surfactant concentration in the second layer is lower than an anti-surfactant concentration in the first layer, or the second layer is non-doped.

The third aspect of the exemplary embodiments of the present invention is the manufacturing method of the first aspect, wherein the second layer is doped by the surfactant.

The fourth aspect of the exemplary embodiments of the present invention is the manufacturing method of the first aspect, wherein the step forming the second layer comprises: forming a non-doped third layer on the first layer from a group III nitride semiconductor; and forming a fourth layer on the third layer from a group III nitride semiconductor while doping a surfactant.

The fifth aspect of the exemplary embodiments of the present invention is the manufacturing method of the first aspect, wherein the step forming the second layer comprises: forming a fifth layer on the first layer from a group III nitride semiconductor while doping a surfactant; and forming a non-doped sixth layer on the fifth layer from a group III nitride semiconductor.

The sixth aspect of the exemplary embodiments of the present invention is a manufacturing method of a group III nitride semiconductor comprising: preparing a substrate including a buffer layer; forming a non-doped first layer from a group III nitride semiconductor by MOCVD, a thickness of the first layer equal to or thinner than 2 μm; forming a second layer from a group III nitride semiconductor doped with a surfactant by MOCVD.

In the exemplary embodiments of the present invention, the group III nitride semiconductors are composite materials described by a general formula $Al_xGa_yIn_zN$, (x+y+z=1, 0≦x, y,z≦1). This expression of the group III nitride semiconductors includes materials obtained by substituting a part of Al, Ga, or In into group X III elements such as B, or Tl, and materials obtained by substituting a part of N into group X V elements such as P, As, Sb, or Bi.

In the exemplary embodiments of the present invention, the surfactant is an impurity which induces a two dimensional growth by restricting the vertical growth (growth perpendicular to the main surface of the substrate) and promoting the lateral growth (growth parallel to the main surface of the substrate). The anti-surfactant is an impurity which induces a three dimensional growth by restricting the lateral growth and promoting the vertical growth. The impurities acting as a surfactant for the group III nitride semiconductors are p-type impurities such as Mg. The impurities acting as an anti-surfactant for the group III nitride semiconductors are n-type impurities such as Si. The actions of these impurities as a surfactant or an anti-surfactant are generally enhanced as the concentration of the impurities increase.

It is not necessary to keep the concentration of the surfactant or the anti-surfactant constant. The concentration of the surfactant or the anti-surfactant may have a gradient. For example, it is possible to gradually reduce the three dimensional growth tendency by reducing the amount of the anti-surfactant while the crystal growth advances. Also, it is possible to gradually enhance the two dimensional growth tendency by increasing the amount of the surfactant while the crystal growth advances.

In a case where the Mg is doped as a surfactant, the preferable range of the Mg concentration in the second layer is $1\times10^{17}$ to $1\times10^{20}/cm^3$. In a case where the Si is doped as an anti-surfactant, the preferable range of the Si concentration in the first layer is $1\times10^{18}$ to $1\times10^{20}/cm^3$. If the concentration of Mg or Si is smaller than these ranges, the action as a surfactant or an anti-surfactant is too small. If the concentration of Mg or Si is larger than these ranges, the crystalline quality is deteriorated.

In the exemplary embodiments of the present invention, "non-dope" means that neither the impurities acting as a surfactant nor the impurities acting as an anti-surfactant is doped. In the exemplary embodiments, non-dope does not eliminate the possibility of impurity doping which act as neither a surfactant nor an anti-surfactant. Also, the meaning of "adjustment of the doping amount" includes adjustment of the doping amount in a certain range, wherein the range may include non-dope in the above meaning.

The preferable range of the first layer thickness is 0.1 μm to 1 μm. Within this range, it is possible to reduce the number of threading dislocations. The preferable range of the second layer thickness is equal to or thicker than 0.1 μm. Within this range, it is possible to enhance the flatness of the second layer surface.

The substrate may be a group III nitride semiconductor substrate or a hetero-type substrate such as a sapphire substrate, a SiC substrate, a spinel substrate, or a Si substrate. The substrate may have a crystal growth surface which is worked so as to have convexes and concaves.

It is also possible to alternately stack the first layer and the second layer once or more than once on the initially formed second layer. As a result, the number of the threading dislocations reduces and more high quality group III nitride semiconductors can be obtained.

The seventh aspect of the exemplary embodiment of the present invention is the manufacturing method of the group III nitride semiconductor according to the first aspect, wherein the anti-surfactant for the first layer is Si.

The eighth aspect of the exemplary embodiment of the present invention is the manufacturing method of the group III nitride semiconductor according to the seventh aspect, wherein the concentration of Si in the first layer is $1\times10^{18}$ to $1\times10^{20}/cm^3$.

The ninth aspect of the exemplary embodiment of the present invention is the manufacturing method of the group III nitride semiconductor according to the first aspect, wherein the surfactant for the second layer is Mg.

The tenth aspect of the exemplary embodiment of the present invention is the manufacturing method of the group III nitride semiconductor according to the ninth aspect, wherein the concentration of Mg in the second layer is $1\times10^{17}$ to $1\times10^{20}/cm^3$.

The eleventh aspect of the exemplary embodiment of the present invention is the manufacturing method of the group III nitride semiconductor according to the first aspect, wherein the anti-surfactant for the first layer is Si and the surfactant for the second layer is Mg.

The twelfth aspect of the exemplary embodiment of the present invention is the manufacturing method of the group III nitride semiconductor according to the eleventh aspect, wherein the concentration of Si in the first layer is $1\times10^{18}$ to $1\times10^{20}/cm^3$ and the concentration of Mg in the second layer is $1\times10^{17}$ to $1\times10^{20}/cm^3$.

The thirteenth aspect of the exemplary embodiment of the present invention is the manufacturing method of the group III nitride semiconductor according to the first aspect, comprising: alternately stacking the first layer and the second layer repeatedly more than once on the firstly formed second layer.

The fourteenth aspect of the exemplary embodiment of the present invention is the manufacturing method of the group III nitride semiconductor according to the first aspect, comprising: stacking the first layer and the second layer repeatedly more than once on the firstly formed second layer.

The fifteenth aspect of the exemplary embodiment of the present invention is the manufacturing method of the group III nitride semiconductor according to the first aspect, wherein a surface of the substrate on which the first layer formed has convexes and concaves.

The sixteenth aspect of the exemplary embodiment of the present invention is the manufacturing method of the group III nitride semiconductor according to the first aspect, wherein the first layer and the second layer are GaN.

The seventeenth aspect of the exemplary embodiment of the present invention is the manufacturing method of the group III nitride semiconductor according to the first aspect, wherein the first layer and the second layer grow in a same crystal growth condition.

According to the first to the sixth aspect of the exemplary embodiments of the present invention, a high quality group III nitride semiconductor with few threading dislocations can be easily obtained since the crystal growth mode of the high quality group III nitride semiconductor changes from the three dimensional growth to two dimensional growth. Since the thickness of the layer grown in the three dimensional growth is restricted so as to be equal to or thinner than 2 μm, a group III nitride semiconductor with high surface flatness can be obtained.

According to the seventh to the twelfth aspect of the exemplary embodiments of the present invention, Si, which is used as an n-type dopant for group III nitride semiconductors, is used as an anti-surfactant and Mg, which is used as a p-type dopant for group III nitride semiconductors, is used as a surfactant. Therefore, the manufacturing method of the group III nitride semiconductors has high integrity with related group III nitride semiconductors manufacturing methods. Also, it is possible to improve the surface flatness and the crystalline quality of the group III nitride semiconductors by setting the range of the Si concentration within the range from $1\times10^{18}$ to $1\times10^{20}/cm^3$ when Si is used as an anti-surfactant, and by setting the rage of the Mg concentration within the range from $1\times10^{17}$ to $1\times10^{20}/cm^3$ when Mg is used as a surfactant.

According to the thirteenth aspect of the exemplary embodiments of the present invention, the crystalline quality of the group III nitride semiconductors is improved by stacking the first layer and the second layer repeatedly.

According to the fourteenth aspect of the exemplary embodiment of the present invention, in a case where the substrate whose surface is worked so as to have convexes and concaves, group III nitride semiconductors with high surface flatness can be obtained.

According to the fifteenth aspect of the exemplary embodiment of the present invention, GaN can be used as the first and the second layers.

According to the sixteenth aspect of the exemplary embodiment of the present invention, it is possible to control the crystalline quality and the surface flatness of the second layer by controlling dopant only if the first layer and the second layer are grown under the same condition. Therefore, the manufacturing process can be simplified.

DETAIL DESCRIPTION OF EXEMPLARY EMBODIMENTS

Exemplary embodiments of the present invention are explained below with reference to the drawings. The embodiments of the present invention are not limited to the following ones.

First Exemplary Embodiment

Figure 1A:
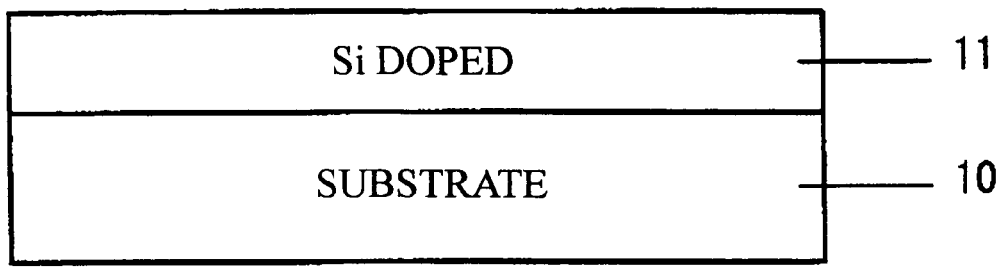
FIG. 1 shows a manufacturing method of a sample according to the first exemplary embodiment.

A sample according to the first exemplary embodiment was manufactured by the manufacturing method described below. At first, a sapphire substrate 10, whose surface was flat and was not worked, was prepared. The sapphire substrate 10 was annealed in hydrogen atmosphere so as to remove surface adsorbates. Then, a Si doped GaN layer (corresponding to the first layer) 11 was formed by MOCVD on the surface of the sapphire substrate 10 via buffer layer of AlN (not shown) (FIG. 1A). The Si concentration in the Si doped GaN layer 11 was set within the range from $1\times10^{18}$ to $1\times10^{20}/cm^3$ and the thickness of the Si doped GaN layer 11 was 1 μm. For the MOCVD process, the carrier gas was hydrogen gas and nitrogen gas, the nitrogen source was ammonia, the gallium source was TMG (trimethylgallium), and the dopant gas was silane ($SiH_4$). The growth conditions such as the growth temperature and pressure were usually adopted conditions for the crystal growth of the group III nitride semiconductors. For example, the growth temperature was 900 to 1300 degrees Celsius and the pressure was the normal pressure.

The doped Si not only acts as a n-type dopant but also acts as an anti-surfactant inducing the three dimensional growth of the GaN layer 11. Therefore, a large number of island shape crystal core are generated on the surface of the sapphire substrate 10 during the initial growth stage of the GaN layer 11. While the three dimensional growth of the crystal cores advances, the crystal cores are combined each other. During the crystal core fusions, the threading dislocations are bent and the number of the threading dislocations reduces while the GaN layer 11 growth.

The reason the range of the Si concentration in the Si doped GaN layer 11 was set from $1\times10^{18}/cm^3$ to $1\times10^{20}/cm^3$ is that the effect as an anti-surfactant is too small in a case where the Si concentration in the Si doped GaN layer 11 is lower than $1\times10^{18}/cm^3$ and the crystalline quality of the Si doped GaN layer 11 is deteriorated in a case where the Si concentration in the Si doped GaN layer is higher than $1\times10^{20}/cm^3$. Also, there is a tendency that the higher the Si concentration is, the better the crystalline quality and the worse the surface flatness is.

Figure 1B:
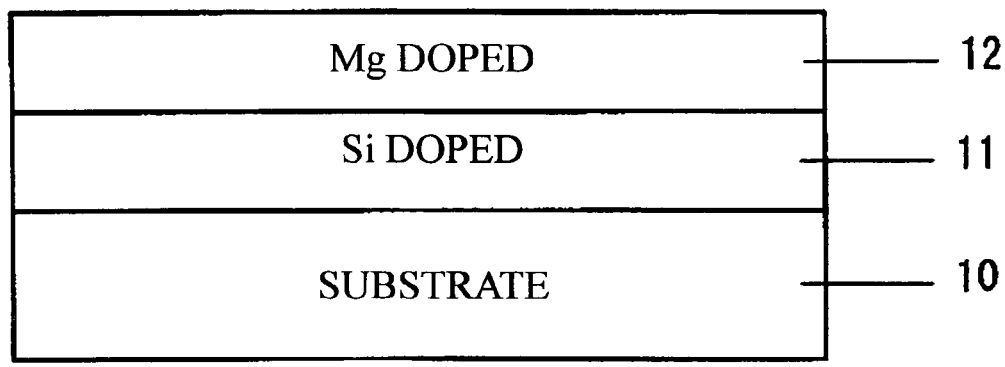

Next, after terminating the supply of silane, a Mg doped GaN layer 12 (corresponding to the second layer) was formed on the Si doped GaN layer 11 by MOCVD while supplying $Cp_2Mg$ (Bis(cyclopentadienyl)magnesium)(FIG. 1B). During the formation of the Mg doped GaN layer 12, the growth conditions such as the growth temperature and the pressure are same as that of the formation of the Si doped GaN layer 11 except for the type and the amount of the dopant. The concentration of the Mg in the Mg doped GaN layer 12 was $7\times10^{19}/cm^3$ and the thickness of the Mg doped GaN layer 12 was 1.3 μm.

The reason that the Mg doped GaN layer 12 was formed on the Si doped GaN layer 11 is as below. Since the Si doped GaN layer 11 grows in the three dimensional growth, the surface flatness of the Si doped GaN layer 11 is bad. Therefore, the crystal growth mode is changed from the three dimensional growth to the two dimensional growth by forming GaN layer 12 while doping Mg acting as a surfactant. Accordingly, it is possible to enhance the crystalline quality by reducing the number of the threading dislocation and the surface flatness.

Although the thickness of the Si doped GaN layer 11 is 1 μm in the first exemplary embodiment, the thickness of the Si doped GaN layer 11 is in effect if the thickness thinner than 2 μm. In a case where the thickness of the Si doped GaN layer 11 is thicker than 2 μm, the surface flatness of the Si doped GaN layer is too deteriorated and it is impossible to improve the surface flatness even by forming the Mg doped GaN layer 12.

The Mg concentration of the Mg doped GaN layer 12 is $7\times10^{19}/cm^3$ in the first exemplary embodiment, the Mg concentration of the Mg doped GaN layer 12 is in effect if the concentration in the range from $1\times10^{17}/cm^3$ to $1\times10^{20}/cm^3$. In a case where the concentration of the Mg is lower than $1\times10^{17}/cm^3$, the effect of Mg as a surfactant is too small. In a case where the concentration of the Mg is higher than $1\times10^{20}/cm^3$, the crystalline quality is deteriorated.

A sample 1A of the first exemplary embodiment and comparative examples 1, 2 were compared with each other with respect to the crystalline quality in the c-plane and the surface flatness of the GaN crystals. In the sample 1A, the Si concentration in the Si doped GaN layer 11 was $1.09\times10^{19}/cm^3$. The comparative example 1 had a GaN layer on a sapphire substrate 10. The thickness of the GaN layer of the comparative example 1 was 2.3 μm same as sum of the thicknesses of the Si doped GaN layer 11 and the Mg doped GaN layer 12. The Si concentration of the GaN layer of the comparative example 1 was $6\times10^{18}/cm^3$. The GaN layer of the comparative example 1 was grown by MOCVD in the growth condition same as that for the Si doped GaN layer 11 and Mg doped GaN layer 12 of the sample 1A. The comparative example 2 had a GaN layer on a sapphire substrate 10. The thickness of the GaN layer of the comparative example 2 was 2.3 μm. The Si concentration of the GaN layer of the comparative example 2 was $1.09\times10^{19}/cm^3$ same as that of the Si doped GaN layer 11 of the sample 1A. The GaN layer of the comparative example 2 was grown by MOCVD in the growth condition same as that for the Si doped GaN layer 11 and Mg doped GaN layer 12 of the sample 1A. The crystalline quality was evaluated by a half-value width of the X-ray locking curve.

As a result of the comparison, the Mg doped GaN layer 12 of the sample 1A and the comparative example 1 had a flat surface respectively. The GaN layer of the comparative example 2 had a rough surface and low surface flatness. The half-value width of the X-ray locking curve of the Mg doped GaN layer 12 of the sample 1A in c-plane was 0.66, and the half-value width of the X-ray locking curve of the GaN layer of the comparative example 2 in c-plane was 0.95. In other words, the Mg doped GaN layer 12 of the sample 1A had a crystalline quality better than those of the GaN layers of the comparative examples 1, 2. Wherein, the half-value widths of the X-ray locking curves of the sample 1A and the comparative example 2 were normalized by the half-value width of the X-ray locking curve of the GaN layer of the comparative example 1.

A sample 1B of the first exemplary embodiment was also compared with the comparative examples 1, 2 with respect to the crystalline quality and the surface flatness. In the sample 1B, the Si concentration in the Si doped GaN layer 11 was $1.41 \times 10^{19}/cm^3$. The sample 1B also had a flat surface. The half-value width of the X-ray curve of the Mg doped GaN layer of the sample 1B in c-plane was 0.84. Thus, the Mg doped GaN layer of the sample 1B had a crystalline quality better than those of the GaN layers of the comparative examples 1, 2.

In order to more reduce the number of the threading dislocation and achieve higher surface flatness, it is preferable to set the thickness of the Si doped GaN layer 11 in the rage from 0.1 μm to 1 μm, set the Si concentration in the Si doped GaN layer 11 in the range from $8 \times 10^{18}/cm^3$ to $1 \times 10^{20}/cm^3$, set the thickness of the Mg doped GaN layer 12 in the range from 0.1 μm to 1 μm, and set the Mg concentration in the Mg doped GaN layer 12 in the range from $1 \times 10^{19}/cm^3$ to $1 \times 10^{20}/cm^3$.

Also, it is not necessary that the Si concentration in the Si doped GaN layer 11 and the Mg concentration in the Mg doped GaN layer 12 are constant in the thickness direction of the GaN layers. For example, it is possible to gradually change the crystal growth mode from the three dimensional growth to the two dimensional growth by reducing the Si concentration in the Si doped GaN layer 11 toward the Mg doped GaN layer 12 continually or in stages and reducing the Mg concentration in the Mg doped GaN layer 12 toward the Si doped GaN layer 11 continually or in stages.

Second Exemplary Embodiment

Figure 2:
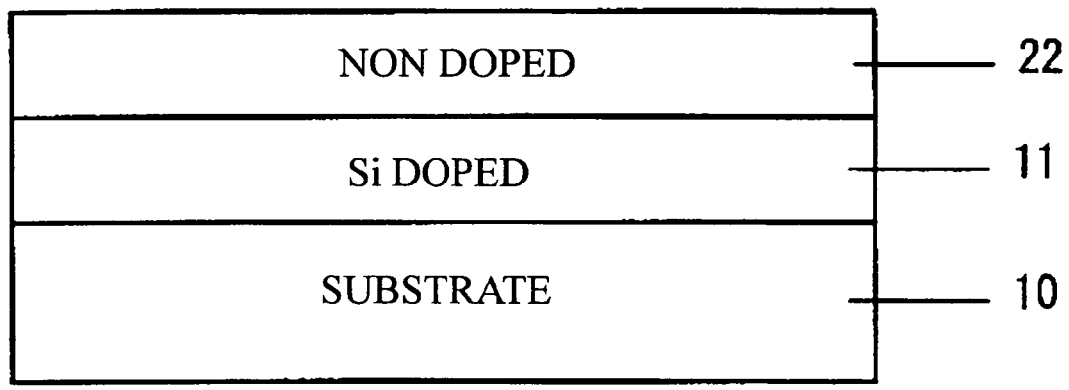
FIG. 2 shows a configuration of a sample according to the second exemplary embodiment.

A sample of the second exemplary embodiment is shown in FIG. 2. The sample of the second exemplary embodiment was same as the samples according to the first exemplary embodiment except for that the sample has a non-doped GaN layer 22 instead of the Mg doped GaN layer 12 in the first exemplary embodiment. The growth conditions such as the growth temperature and pressure for the non-doped GaN layer 22 was same as those of the first exemplary embodiment. In the crystal growth of the non-doped GaN layer 22, the three dimensional growth is relatively dominant but the tendency of the three dimensional growth is less than that of the Si doped GaN layer 11. Therefore, it is possible to gradually change the crystal growth mode from three dimensional growth to the weak three dimensional growth by stacking the Si doped GaN layer 11 ad the non-doped GaN layer 22 in this order. As a result, the number of the threading dislocation can be reduced and the high surface flatness can be achieved.

The crystalline quality of the non-doped GaN layer 22 in the c-plane of a sample 2A according to the second exemplary embodiment was evaluated. In the sample 2A, the Si concentration in the Si doped GaN layer 11 was $1.09 \times 10^{19}/cm^3$. As a result of comparison with the comparative examples 1, 2, the half-value width of the non-doped GaN layer 22 of the sample 2A was 0.90 (normalized by the half-value width of the X-ray locking curve of the GaN layer of the comparative example 1). Thus, the non-doped GaN layer 22 of the sample 2A was found to have a better crystalline quality than comparative examples 1, 2. Also, the surface of non-doped GaN layer 22 of the sample 2A was found to be flat as same as the surface of the GaN layer of the comparative example 1.

The crystalline quality of the non-doped GaN layer 22 in the c-plane of a sample 2B according to the second exemplary embodiment was evaluated. In the sample 2B, the Si concentration in the Si doped GaN layer 11 was $1.41 \times 10^{19}/cm^3$. As a result of comparison with the comparative examples 1, 2, the half-value width of the non-doped GaN slyer 22 of the sample 2B was 0.83 (normalized by the half-value width of the X-ray locking curve of the GaN layer of the comparative example 1). Thus, the non-doped GaN layer 22 of the sample 2B was found to have a better crystalline quality than comparative examples 1, 2. Also, the surface of non-doped GaN layer 22 of the sample 2B was found to be flat as same as the surface of the GaN layer of the comparative example 1.

Third Exemplary Embodiment

Figure 3:
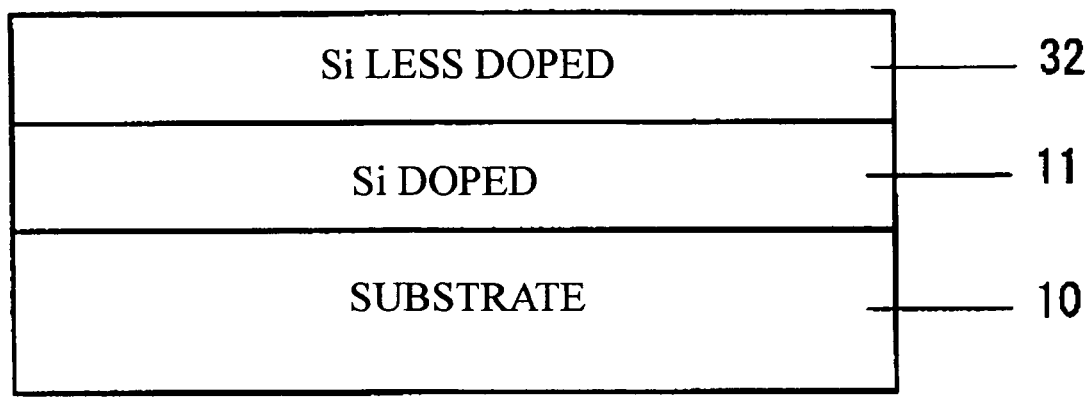
FIG. 3 shows a configuration of a sample according to the third exemplary embodiment.

A sample of the third exemplary embodiment is shown in FIG. 3. The sample of the third exemplary embodiment is same as the exemplary embodiment 1 except for that the sample has a Si less doped GaN layer 32 instead of the Si doped GaN layer 12 in the first exemplary embodiment. The Si concentration in the Si less doped GaN layer 32 is lower than that in the Si doped GaN layer 11. The Si less doped GaN layer 32 less favors the three dimensional growth as compared to the Si doped GaN layer 11. Therefore, it is possible to gradually change the growth mode from the three dimensional growth to the weak three dimensional growth by stacking the Si doped GaN layer 11 and the Si less doped GaN layer 32 in this order. As a result, it is possible to reduce the number of the threading dislocation and improve the surface flatness.

The crystalline quality of the Si less doped GaN layer 32 in the c-plane of a sample 3A according to the third exemplary embodiment was evaluated. In the sample 3A, the Si concentration in the Si doped GaN layer 11 was $1.09 \times 10^{19}/cm^3$ and the Si concentration in the Si less doped GaN layer 32 was $2.3 \times 10^{18}/cm^3$. As a result of comparison with the comparative examples 1, 2, the half-value width of the Si less doped GaN layer 32 of the sample 3A was 0.89 (normalized by the half-value width of the X-ray locking curve of the GaN layer of the comparative example 1). Thus, the Si less doped GaN layer 32 of the sample 3A was found to have a better crystalline quality than comparative examples 1, 2. Also, the surface of the Si less doped GaN layer 32 of the sample 3A was found to be flat as same as the surface of the GaN layer of the comparative example 1.

The crystalline quality of the Si less doped GaN layer 32 in the c-plane of a sample 3B according to the third exemplary embodiment was evaluated. In the sample 3B, the Si concentration in the Si doped GaN layer 11 was $1.41 \times 10^{19}/cm^3$ and the Si concentration in the Si less doped GaN layer 32 was $2.3 \times 10^{18}/cm^3$. As a result of comparison with the comparative examples 1, 2, the half-value width of the Si less doped GaN layer 32 of the sample 3B was 0.74 (normalized by the half-value width of the X-ray locking curve of the GaN layer of the comparative example 1). Thus, the Si less doped GaN layer 32 of the sample 3B was found to have a better crystalline quality than comparative examples 1, 2. Also, the surface of the Si less doped GaN layer 32 of the sample 3B was found to be flat as same as the surface of the GaN layer of the comparative example 1.

Fourth Exemplary Embodiment

Figure 4:
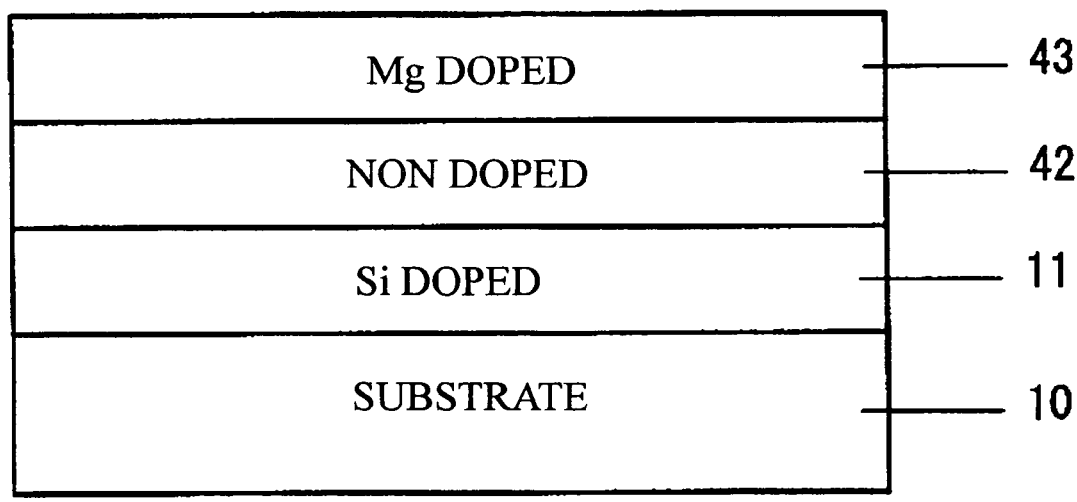
FIG. 4 shows a configuration of a sample according to the fourth exemplary embodiment.

A sample of the fourth exemplary embodiment is shown in FIG. 4. The sample of the fourth exemplary embodiment has a non-doped GaN layer 42 (the third layer) on the Si doped GaN layer 11 and a Mg doped GaN layer 43 (the fourth layer) on the non-doped GaN layer 42. The growth conditions such as growth temperature and pressure for the non-doped GaN layer 42 and the Mg doped GaN layer 43 are same as those of the Mg doped GaN layer 12. The sum of the thickness of the non-doped GaN layer 42 and the Mg doped GaN layer 43 is 1.3 μm same as the Mg doped GaN layer 12. The Mg concentration of the Mg doped GaN layer 43 is $7\times10^{19}/cm^3$ as same as the Mg doped layer 12.

Since the non-doped GaN layer 42 is non-dope, the non-doped GaN layer 42 favors the week three dimensional growth. Also, since the Mg doped GaN layer 43 is Mg doped, the Mg doped GaN layer 43 favors the two dimensional growth. Therefore, it is possible to change the crystal growth mode from the three dimensional growth to the week three dimensional growth and from the week three dimensional growth to the two dimensional growth by stacking the Si doped GaN layer 11, the non-doped GaN layer 42, and the Mg doped GaN layer 43 in this order. As a result, it is possible to reduce the number of the threading dislocation in the Mg GaN layer 43 and improve the surface flatness thereof.

The crystalline quality of the Mg doped GaN layer 43 in the c-plane of a sample 4A according to the fourth exemplary embodiment was evaluated. In the sample 4A, the Si concentration in the Si doped GaN layer 11 was $1.09\times10^{19}/cm^3$. The thickness of the non-doped GaN layer 42 is 0.65 μm and the thickness of the Mg doped GaN layer 43 is 0.65 μm. As a result of comparison with the comparative examples 1, 2, the half-value width of the Mg doped GaN layer 43 of the sample 4A was 0.86 (normalized by the half-value width of the X-ray locking curve of the GaN layer of the comparative example 1). Thus, the Mg doped GaN layer 43 of the sample 4A was found to have a better crystalline quality than comparative examples 1, 2. Also, the surface of the Mg doped GaN layer 43 of the sample 4A was found to be flat as same as the surface of the GaN layer of the comparative example 1.

The crystalline quality of the Mg doped GaN layer 43 in the c-plane of a sample 4B according to the fourth exemplary embodiment was evaluated. In the sample 4B, the Si concentration in the Si doped GaN layer 11 was $1.09\times10^{19}/cm^3$. The thickness of the non-doped GaN layer 42 is 0.9 μm and the thickness of the Mg doped GaN layer 43 is 0.4 μm. As a result of comparison with the comparative examples 1, 2, the half-value width of the Mg doped GaN layer 43 of the sample 4B was 0.88 (normalized by the half-value width of the X-ray locking curve of the GaN layer of the comparative example 1). Thus, the Mg doped GaN layer 43 of the sample 4B was found to have a better crystalline quality than comparative examples 1, 2. Also, the surface of the Mg doped GaN layer 43 of the sample 4B was found to be flat as same as the surface of the GaN layer of the comparative example 1.

The crystalline quality of the Mg doped GaN layer 43 in the c-plane of a sample 4C according to the fourth exemplary embodiment was evaluated. In the sample 4C, the Si concentration in the Si doped GaN layer 11 was $1.41\times10^{19}/cm^3$. The thickness of the non-doped GaN layer 42 is 0.9 μm and the thickness of the Mg doped GaN layer 43 is 0.4 μm. As a result of comparison with the comparative examples 1, 2, the half-value width of the Mg doped GaN layer 43 of the sample 4C was 0.85 (normalized by the half-value width of the X-ray locking curve of the GaN layer of the comparative example 1). Thus, the Mg doped GaN layer 43 of the sample 4C was found to have a better crystalline quality than comparative examples 1, 2. Also, the surface of the Mg doped GaN layer 43 of the sample 4C was found to be flat as same as the surface of the GaN layer of the comparative example 1.

Fifth Exemplary Embodiment

Figure 5:
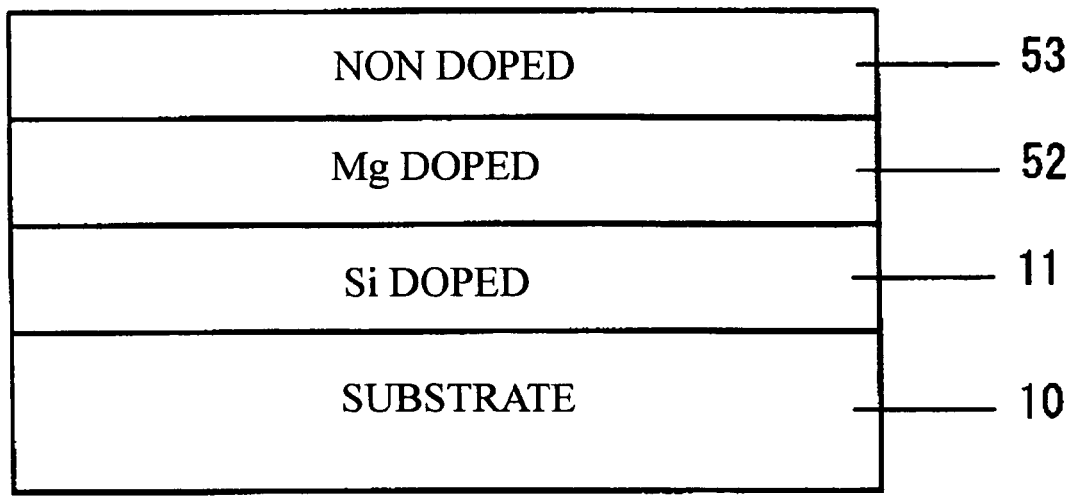
FIG. 5 shows a configuration of a sample according to the fifth exemplary embodiment.

A sample of the fifth exemplary embodiment is shown in FIG. 5. The sample of the fifth exemplary embodiment has a Mg-doped GaN layer 52 (the fifth layer) on the Si doped GaN layer 11 and a non-doped GaN layer 53 (the sixth layer) on the Mg doped GaN layer 52. The growth conditions such as growth temperature and pressure for the Mg doped GaN layer 52 and the non doped GaN layer 53 are same as those of the Mg doped GaN layer 12. The thickness of the Mg-doped GaN layer 52 is 0.4 μm and the non-doped GaN layer 53 is 0.9 μm. The Mg concentration of the Mg doped GaN layer 43 is $7\times10^{19}/cm^3$ as same as the Mg doped layer 12.

Since the Mg doped GaN layer 52 is doped by Mg, the Mg doped GaN layer 52 favors the two dimensional growth. Also, since the non-doped GaN layer 53 is non-dope, the non-doped GaN layer 53 favors the weak three dimensional growth. Therefore, it is possible to change the crystal growth mode from the three dimensional growth to the two dimensional growth and from the two dimensional growth to the week three dimensional growth by stacking the Si doped GaN layer 11, the Mg doped GaN layer 52, and the non-doped GaN layer 53 in this order. As a result, it is possible to reduce the number of the threading dislocation in the non-doped GaN layer 53 and improve the surface flatness thereof.

The crystalline quality of the non-doped GaN layer 53 in the c-plane of a sample 5A according to the fifth exemplary embodiment was evaluated. In the sample 5A, the Si concentration in the Si doped GaN layer 11 was $1.09\times10^{19}/cm^3$. As a result of comparison with the comparative examples 1, 2, the half-value width of the non-doped GaN layer 53 of the sample 5A was 0.97 (normalized by the half-value width of the X-ray locking curve of the GaN layer of the comparative example 1). Thus, the non-doped GaN layer 53 of the sample 5A was found to have a better crystalline quality than comparative examples 1, 2. Also, the surface of the non-doped GaN layer 53 of the sample 5A was found to be flat as same as the surface of the GaN layer of the comparative example 1.

The crystalline quality of the non-doped GaN layer 53 in the c-plane of a sample 5B according to the fifth exemplary embodiment was evaluated. In the sample 5B, the Si concentration in the Si doped GaN layer 11 was $1.41\times10^{19}/cm^3$. As a result of comparison with the comparative examples 1, 2, the half-value width of the non-doped GaN layer 53 of the sample 5B was 0.89 (normalized by the half-value width of the X-ray locking curve of the GaN layer of the comparative example 1). Thus, the non-doped GaN layer 53 of the sample 5B was found to have a better crystalline quality than comparative examples 1, 2. Also, the surface of the non-doped GaN layer 53 of the sample 5B was found to be flat as same as the surface of the GaN layer of the comparative example 1.

Sixth Exemplary Embodiment

Figure 6:
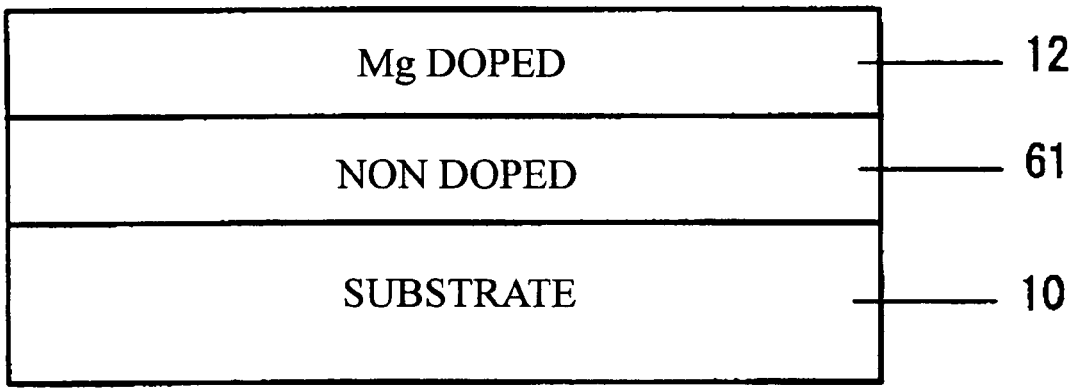
FIG. 6 shows a configuration of a sample according to the sixth exemplary embodiment.

A sample of the sixth exemplary embodiment is shown in FIG. 6. The sample of the sixth exemplary embodiment is same as that of the first exemplary embodiment except for that the example has a non-doped GaN layer 61 instead of the Si doped GaN layer 11. The growth conditions such as growth temperature and pressure for the non-doped GaN layer 61 are same as those of the Si doped GaN layer 11. The Mg doped GaN layer 12 more favors the two dimensional growth than the non-dope GaN layer 61. Therefore, it is possible to change the crystal growth mode from the weak three dimensional growth to the two dimensional growth by stacking the non-doped GaN layer 61 and the Mg doped GaN layer 12 in this order. As a result, it is possible to reduce the number of the dislocation in the non-doped GaN layer 61 and improve the surface flatness thereof.

Seventh Exemplary Embodiment

Figure 7:
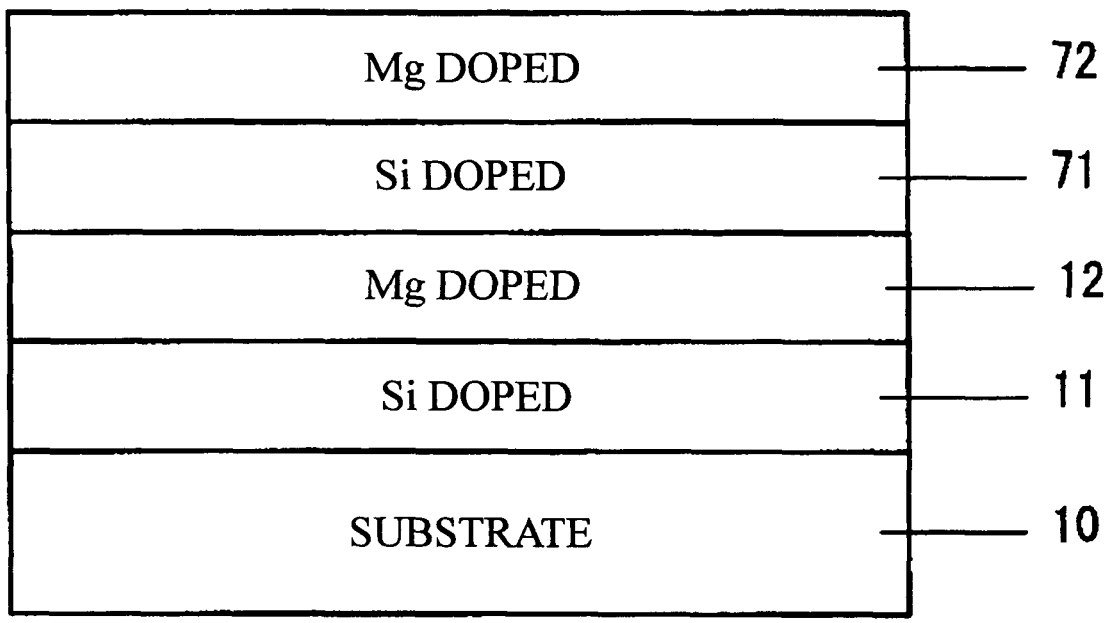
FIG. 7 shows a configuration of a sample according to the seventh exemplary embodiment.

A sample of the seventh exemplary embodiment is shown in FIG. 7. The sample of the seventh exemplary embodiment has such a structure that a Si doped GaN layer 71 and a Mg doped GaN layer 72 stacked by MOCVD on the Mg doped GaN layer 12 of the sample of the first exemplary embodiment. The thickness of the Si doped GaN layer 71 and the Si concentration in the Si doped GaN layer 71 are same as those of the Si doped GaN layer 11. The thickness of the Mg doped GaN layer 72 and the Mg concentration in the Mg doped GaN layer 72 are same as those of the Mg doped GaN layer 12. The crystal growth conditions such as growth temperature and pressure for the Si doped GaN layer 71 and the Mg doped GaN layer 72 are same as those for the Si doped GaN layer 11 and the Mg doped GaN layer 12. The number of the treading dislocations remaining in the Mg doped GaN layer 12 reduces because of the three dimensional growth of the Si doped GaN layer 71. Although the surface flatness is deteriorated due to the three dimensional growth of the Si doped GaN layer 71, the surface flatness is recovered by the two dimensional growth of the Mg doped GaN layer 72 on the Si doped GaN layer 71. As a result, the number of the threading dislocation is more reduced in the Mg doped GaN layer 72 than in the Mg doped GaN layer 12 and the Mg doped GaN layer 72 achieves high crystalline quality with high surface flatness.

The Si doped GaN layer 71 and the Mg doped GaN layer 72 may be repeatedly stacked. The structure of the sample according to the seventh exemplary embodiment can be applied for the samples according to the other exemplary embodiments (from the first exemplary embodiments to the sixth exemplary embodiment). For example, a Si doped GaN layer and a non-doped GaN layer may be repeatedly stacked on the non-doped GaN layer 22 of the sample of the second exemplary embodiment. For example, a non-doped GaN layer and a Mg doped GaN layer may be repeatedly stacked on the Mg doped GaN layer 12 of the sixth exemplary embodiment. In each case, the number of the threading dislocation is further reduced and a crystal with a high crystalline quality and high surface flatness can be obtained.

In any of the exemplary embodiments, Mg is adopted as a surfactant and Si is adopted as an anti-surfactant. The surfactant is not limited to Mg and any other surfactant may be adopted. The anti-surfactant is not limited to Si and any other anti-surfactant may be adopted.

Although any of the exemplary embodiments are manufacturing method for a GaN crystal, the exemplary embodiments of the present invention can be applied for the manufacturing of AlGaN, InGaN, and AlGaInN crystal. Even if the manufacturing method is applied for manufacturing of these materials, it is possible to manufacture a crystal with high crystalline quality and high surface flatness.

In any of the exemplary embodiments, a flat sapphire substrate whose surface is not worked so as to have convexes and concaves. Instead, a substrate whose surface is worked so as to have convexes and the concaves of a stripe shape or a dot shape may be used. When the group III nitride semiconductor grows on the surface having convexes and concaves, it has been difficult for the related arts to obtain a group III nitride semiconductor. According to the exemplary embodiments of the present invention, however, it is possible to obtain a group III nitride semiconductor with high crystalline quality and high surface flatness even if the substrate whose surface is worked so as to have convexes and concaves. Also, SiC, spinel, Si, ZnO, and GaN substrates may be used instead of the sapphire substrate.

In any of exemplary embodiments, the crystal growth conditions such as growth temperature and pressure are same. The GaN layers described in the exemplary embodiments may be formed while the growth temperature and pressure change.

INDUSTRIAL APPLICABILITY

The group III nitride semiconductor obtained by the exemplary embodiments of the present invention can be used for manufacturing semiconductor elements such as light emitting elements.

The invention claimed is:

1. A manufacturing method of a group III nitride semiconductor, said method comprising:
preparing a substrate including a buffer layer;
disposing a first layer from a group III nitride semiconductor doped with an anti-surfactant by metalorganic vapor deposition (MOCVD) on a surface of the buffer layer, wherein a thickness of the first layer is equal to or less than 2 μm;
disposing a second layer to abut a surface of the first layer from a group III nitride semiconductor doped with at least one of a surfactant and an anti-surfactant by the MOCVD; and
controlling a crystalline quality and a surface flatness of the second layer by adjusting an amount of the at least one of the surfactant and the anti-surfactant doped during the disposing of the second layer.

2. The manufacturing method of the group III nitride semiconductor according to claim 1, wherein the second layer is doped by the surfactant.

3. The manufacturing method of the group III nitride semiconductor according to claim 1, wherein the disposing the second layer comprises:
forming a fifth layer on the first layer from a group III nitride semiconductor while doping a surfactant; and
forming a non-doped sixth layer on the fifth layer from a group III nitride semiconductor.

4. The manufacturing method of the group III nitride semiconductor according to claim 1, wherein the anti-surfactant for the first layer comprises Si.

5. The manufacturing method of the group III nitride semiconductor according to claim 4, wherein the concentration of Si in the first layer is $1 \times 10^{18}$ to $1 \times 10^{20}$ /cm$^3$.

6. The manufacturing method of the group III nitride semiconductor according to claim 1, wherein the surfactant for the second layer comprises Mg.

7. The manufacturing method of the group III nitride semiconductor according to claim 6, wherein the concentration of Mg in the second layer is $1 \times 10^{18}$ to $1 \times 10^{20}$ /cm$^3$.

8. The manufacturing method of the group III nitride semiconductor according to claim 1, wherein the anti-surfactant for the first layer comprises Si and the surfactant for the second layer comprises Mg.

9. The manufacturing method of the group nitride semiconductor according to claim 8, wherein a concentration of Si in the first layer is $1 \times 10^{18}$ to $1 \times 10^{20}$/cm$^3$ and a concentration of Mg in the second layer is $1 \times 10^{17}$ to $1 \times 10^{20}$ /cm$^3$.

10. The manufacturing method of the group III nitride semiconductor according to claim 1, wherein a surface of the substrate, on which the first layer is formed, comprises a convex surface and a concave surface.

11. The manufacturing method of the group III nitride semiconductor according to claim 1, wherein the first layer and the second layer comprise GaN.

12. The manufacturing method of the group III nitride semiconductor according to claim 1, wherein the first layer and the second layer grow in a same crystal growth condition.

13. The manufacturing method of the group III nitride semiconductor according to claim 1, wherein the first layer abuts the surface of the buffer layer.

14. The manufacturing method of the group III nitride semiconductor according to claim 1, wherein the disposing the first layer comprises reducing a concentration of the anti-surfactant in the first layer toward the second layer.

15. The manufacturing method of the group III nitride semiconductor according to claim 14, wherein the disposing the second layer comprises reducing a concentration of the surfactant in the second layer toward the first layer.

16. The manufacturing method of the group III nitride semiconductor according to claim 1, wherein said controlling the crystalline quality and the surface flatness of the second layer is performed by adjusting the amount of the anti-surfactant doped during the disposing of the second layer.

17. A manufacturing method of a semiconductor of a light emitting diode (LED), said method comprising:
preparing a substrate including a buffer layer;
disposing a first layer from a group III nitride semiconductor doped with an anti-surfactant by metalorganic vapor deposition (MOCVD) on a surface of the buffer layer, wherein a thickness of the first layer is equal to or less than 2 μm;
disposing a second layer to abut a surface of the first layer from a group III nitride semiconductor doped with at least one of a surfactant and an anti-surfactant by the MOCVD; and
controlling a crystalline quality and a surface flatness of the second layer by adjusting an amount of the at least one of the surfactant and the anti-surfactant doped during the disposing of the second layer.

* * * * *